United States Patent [19]

Ishii et al.

[11] Patent Number: 5,435,877
[45] Date of Patent: Jul. 25, 1995

[54] PROCESS FOR THE PRODUCTION OF COPPER-CLAD LAMINATE

[75] Inventors: Kenji Ishii; Yoshinori Kondo; Hiroyuki Matsumoto; Takamasa Nakai, all of Tokyo, Japan

[73] Assignee: Mitsubishi Gas Chemical Company, Inc., Tokyo, Japan

[21] Appl. No.: 56,536

[22] Filed: May 5, 1993

[30] Foreign Application Priority Data

May 7, 1992 [JP] Japan .................................. 4-114756
Jul. 2, 1992 [JP] Japan .................................. 4-175549

[51] Int. Cl.$^6$ ...................... B32B 31/12; B32B 31/18; B32B 31/20; B32B 31/22
[52] U.S. Cl. ................... 156/264; 156/272.2; 156/307.7; 156/320
[58] Field of Search ............... 156/150, 307.1, 324, 156/273.3, 275.5, 320, 283, 264, 307.1, 272.2

[56] References Cited

U.S. PATENT DOCUMENTS

| | | | |
|---|---|---|---|
| 3,660,199 | 5/1972 | Riccitiello et al. | 156/307.1 |
| 4,579,612 | 4/1986 | Held | 156/307.7 X |
| 4,956,053 | 9/1990 | Polan et al. | 204/13 |
| 5,368,674 | 11/1994 | Ishii et al. | 156/272.2 |

FOREIGN PATENT DOCUMENTS

| | | | |
|---|---|---|---|
| 63-158216 | 7/1988 | Japan | 156/264 |
| 63-158217 | 7/1988 | Japan | 156/264 |
| 1148519 | 6/1989 | Japan | 156/307.7 |
| 1148520 | 6/1989 | Japan | 156/307.7 |
| 1225545 | 9/1989 | Japan | 156/307.7 |
| 3183188 | 8/1991 | Japan | 156/307.1 |
| 5-92423 | 4/1993 | Japan | 156/307.1 |

OTHER PUBLICATIONS

Patent Abstracts of Japan, vol. 015, No. 008 (M-1067)9 Jan., 1991 & JP-A-02 258 337 (Sumitomo Bakelite Co., Ltd.) 19 Oct. 1990 *abstract*.
Patent Abstracts of Japan, vol. 015, No. 362 (M-1157)12 Sep. 1991 & JP-A-03 142 239 (Hitachi Chemical Co., Ltd.) 18 Jun. 1991 *abstract*.
Database WPI Week 9139, Derwent Publications Ltd., London, GB; An 91-286194 & JP-A-63 132 044 Shin Kolbe Elec Mach) 4 Jun. 1988 *abstract*.

*Primary Examiner*—Adrienne Johnstone
*Attorney, Agent, or Firm*—Wenderoth, Lind & Ponack

[57] ABSTRACT

A process for the production of a copper-clad laminate which is improved in dimensional accuracy and freedom from bow and twist and shows nearly the same values of dimensional accuracy, thermal expansion coefficient and elastic modulus in the length and width directions, the process using:

- a prepreg (I) comprising a glass cloth (I-1) having a thickness of $190\pm20$ μm, a weight of $210\pm20$ g/m$^2$, warp and weft counts of 35 to 38 yarns/25 mm and a warp and weft difference of 2 yarns or less in count, and
- a copper foil (II) having a ductility, measured in atmosphere at 180° C. in length and width directions, of at least 10% when it is a ½ oz/Ft$^2$ foil, at least 15% when it is a 1 oz/Ft$^2$ foil and at least 20% when it is a 2 oz/Ft$^2$ foil, and
- the set of the prepreg or prepregs and copper foil or copper foils is laminate-molded by curing it under predetermined heat in a laminate-molding step using a press machine, removing the application of pressure and then cooling the resultant laminate in the press machine.

13 Claims, No Drawings

PROCESS FOR THE PRODUCTION OF COPPER-CLAD LAMINATE

FIELD OF THE INVENTION

The present invention relates to a process for the production of a copper-clad laminate (particularly a copper-clad laminate of FR-4 grade) and a composite copper-clad laminate (copper-clad laminate of CEM-3 grade), which are free from a dimensional change and bow/twist in the step of manufacturing a printed circuit board.

PRIOR ART

For manufacturing a printed circuit board, an FR-4 material formed of a glass cloth as a substrate and a CEM-3 material formed of a composite of a glass cloth and an unwoven glass fabric as a substrate are widely used.

It is said that the FR-4 material is excellent over the CEM-3 material in mechanical strength, dimensional stability and heat resistance and is highly reliable concerning the formability of through holes. The FR-4 material is thus widely used in the field of industrial electronic parts and equipment.

However, with a recent rapid decrease in the weight, thickness and size of electronic parts and equipment and with a rapid advance in surface mounting technology, the thickness of a copper-clad laminate decreases. As a result, the copper-clad laminate suffers the deterioration of dimensional accuracy and the bow/twist to a greater degree than a copper-clad laminate having a conventional thickness.

Further, the dimensional accuracy, thermal expansion coefficient and elastic modulus of a conventional FR-4 material differ between its length direction and width direction. For this reason, the conventional FR-4 material is not sufficiently reliable concerning the solderability in a cold/hot heating cycle test.

Further, the FR-4 material has a problem in that through holes cannot be made in it by punching, and a CEM-3 material in which through holes can be made is increasingly used in the field of commercial electronic parts and equipment.

The CEM-3 material uses a prepreg of an unwoven glass fabric as an intermediate layer and is advantageous in price and processability. However, the defect with the CEM-3 material is that it shows poor dimensional stability and great bow/twist.

In order to overcome the above defect, JP-A-2-258337 discloses a method in which a copper foil having high ductility is used to form a laminate and the laminate is annealed. This method is somewhat effective to achieve dimensional stability in the roll-winding direction (length direction) of a glass cloth prepreg but is insufficient to achieve dimensional stability in the width (lateral) direction. Further, this method requires annealing treatment.

SUMMARY OF THE INVENTION

It is an object of the present invention to provide a process for the production of a copper-clad laminate improved in dimensional accuracy and freedom from bow/twist, which is formed of a prepreg comprising a glass cloth as a substrate and a thermosetting resin or formed of prepregs comprising a glass cloth as a substrate and a thermosetting resin and an intermediate layer of a prepreg comprising an unwoven glass fabric and a thermosetting resin containing an inorganic filler.

It is another object of the present invention to provide a process for the production of a copper-clad laminate which shows nearly the same values of dimensional accuracy, thermal expansion coefficient and elastic modulus in the length and width directions.

According to the present invention, there is provided a process for the production of a copper-clad laminate by placing one prepreg formed of a glass cloth and a thermosetting resin or stacking at least two prepregs formed as above, either placing a copper foil on one surface of the prepreg or the stacked set of the prepregs or placing copper foils on both surfaces of the prepreg or the stacked set of the prepregs, one copper foil on one surface each, and laminate-molding the resultant set, wherein:
  a prepreg (I) comprising a glass cloth (I-1) having a thickness of $190\pm20$ μm, a weight of $210\pm20$ g/m$^2$, warp and weft counts of 35 to 38 yarns/25 mm and a warp and weft difference of 2 yarns or less in count is used as the prepreg,
  a copper foil (II) having a weight of either ½ oz/Ft$^2$, 1 oz/Ft$^2$ or 2 oz/Ft$^2$ and a ductility, measured in atmosphere at 180° C. in the length and width directions, of at least 10% when it is a ½ oz/Ft$^2$ foil, at least 15% when it is a 1 oz/Ft$^2$ foil and at least 20% when it is a 2 oz/Ft$^2$ foil is used as the copper foil, and
  the laminate-molding is carried out by curing the set of the prepreg(s) and copper foil(s) under predetermined heat in a laminate-molding step using a press machine, removing the application of pressure and then (III) cooling the resultant laminate in the press machine.

Further, according to the present invention, there is provided a process for the production of a composite copper-clad laminate by stacking prepregs formed of a glass cloth and a thermosetting resin on both surfaces of a prepreg formed of a glass unwoven fabric and a thermosetting resin, one prepreg on one surface each, placing a copper foil on one surface of the stacked set of the prepregs or placing copper foils on both surfaces of the stacked set of the prepregs, one copper foil on one surface each, and laminate-molding the resultant set, wherein:
  a prepreg (I) comprising a glass cloth (I-1) having a thickness of $190\pm20$ μm, a weight of $210\pm20$ g/m$^2$, warp and weft counts of 35 to 38 yarns/25 mm and a warp and weft difference of 2 yarns or less in count is used as the prepreg,
  a copper foil (II') having a weight of either ½ oz/Ft$^2$, 1 oz/Ft$^2$ or 2 oz/Ft$^2$ and a ductility, measured in atmosphere at 180° C. in length and width directions, of at least 20% when it is a ½ oz/Ft$^2$ foil, at least 30% when it is a 1 oz/Ft$^2$ foil and at least 40% when it is a 2 oz/Ft$^2$ foil is used as the copper foil, and
  the laminate-molding is carried out by curing the set of the prepreg(s) and copper foil(s) under predetermined heat in a laminate-molding step using a press machine, removing the application of pressure and then (III) cooling the resultant laminate in the press machine.

DETAILED DESCRIPTION OF THE INVENTION

The present invention is directed to a process for the production of a copper-clad laminate, which comprising placing one prepreg (I) formed of a glass cloth (I-1) having a thickness of 190±20 μm, a weight of 210±20 g/m² warp and weft counts of 35 to 38 yarns/25 mm and a warp and weft difference of 2 yarns or less in count and a thermosetting resin (I-2), or stacking at least two prepregs (I) formed as above, placing a copper foil (II) on one surface of the prepreg (I) or the stacked prepregs (I) or placing copper foils (II) on both surfaces of the prepreg (I) or the s tacked prepregs (I), one copper foil on one surface, the copper foil (II) having a ductility, measured at 180° C. in length and width directions, of at least 10% when it is a ½ oz/Ft² foil, at least 15% when it is a 1 oz/Ft² foil and at least 20% when it is a 2 oz/Ft² foil, curing the resultant set of the prepreg(s) and copper foil(s) under predetermined heat in a laminate-molding step using a press machine, (III) removing the application of pressure and cooling the resultant laminate in the pressing machine.

In a preferred embodiment of the present invention, the prepreg (I) is prepared by cutting the prepreg (I) material into sheets (prepreg (I)) having predetermined size and heating the prepreg(s) (I) while being stacked one on another or not stacked with a far infrared ceramic heater for a short period of time under the conditions where (a) the interior of the prepreg (I) is temperature-increased only up to a temperature well below the softening point (Ts) of the matrix resin of the prepreg (I), (b) the surface of the prepreg (1) is temperature-increased up to a temperature higher than the above softening point (Ts) and (c) the amount of heat applied to the prepreg (I) does not exceed an amount of heat sufficient for increasing the temperature of the prepreg (I) up to a temperature at least 10° C. lower than the softening point (Ts). In heating the prepreg (I) under the above conditions, matrix resin dust which has occurred during the cutting of the prepreg (I) material is set on the prepreg (I). More preferred embodiments of the present invention will be detailed below. The prepreg (I) sheets are heated for a short period of time one by one.

The glass cloth (I-1) is a glass cloth whose warp and weft are both formed of Z twist (right hand lay) yarns and S twist (left hand lay) yarns which are alternately laid. The glass cloth (I-1) is a glass cloth whose tensile strength is embrittled to 20 to 50 kgf/25 mm both in the length and width directions.

The copper foil (II) has a ductibility, measured in an atmosphere at 180° C. both in length and width directions, of at least 20% when it is a ½ oz/Ft² foil, at least 30% when it is a 1 oz/Ft² foil and at least 40% when it is a 2 oz/Ft² foil. The copper foil (II) is an electrodeposited copper foil having a folding endurance value both in the length direction and width direction, measured with an MIT tester with R=0.8 mm at 0.25 kg after heat-treated at 180° C. for 1 hour, of at least 600 times when it is a ½ oz/Ft² foil, at least 250 times when it is a 1 oz/Ft² foil and at least 50 times when it is a 2 oz/Ft² foil.

Further, the prepreg (I) contains 5 to 30% by weight of an inorganic filler having an average particle diameter of 5 to 0.1 μm, at least 90% of which has a particle diameter of 5 to 0.02 μm, and the prepreg (I) shows a decrease in surface undulation based on the glass cloth.

The above inorganic filler is selected from the group consisting of calcined kaolin, spherical fused silica, unswelling synthetic mica and finely milled glass. These inorganic fillers may be used alone or in combination. The inorganic filler may be surface-treated with a coupling agent.

Further, the present invention provides a process for the production of a so-called composite copper-clad laminate, which comprises placing an intermediate layer of one prepreg (IV) formed of an unwoven glass fabric and a thermosetting resin containing 30 to 50% by weight, based on the prepreg (IV), of an inorganic filler or stacking at least two prepregs (IV) formed as above to form a first laminate, stacking the prepreg (I) on each surface of the prepreg (IV) or the first laminate to form a second laminate, placing a copper foil (II') on one surface of the second laminate or placing copper foils (II') on both surfaces of the second laminate, one foil on one surface, the copper foil (II') having a ductility, measured in atmosphere at 180° C. in the length and width directions, of at least 20% when it is a ½ oz/Ft² foil, at least 30% when it is a 1 oz/Ft² foil and at least 40% when it is a 2 oz/Ft² foil, curing the resultant copper-clad laminate under predetermined heat in a laminate-forming step using a press machine, removing the application of pressure and (III) cooling the laminate in the pressing machine. The prepreg (I) or (IV) is prepared by cutting the prepreg (I) or (IV) material into sheets (prepregs (I) or (IV)) having predetermined size and heating the prepreg(s) (I) or (V) while being stacked one on another or not stacked with a far infrared ceramic heater for a short period of time under the conditions where (a) the interior of the prepreg (I) or (IV) is temperature-increased only up to a temperature well below the softening point (Ts) of the matrix resin of the prepreg (I) or (V), (b) the surface of the prepreg (1) or (IV) is temperature-increased up to a temperature higher than the above softening point (Ts) and (c) the amount of heat applied to the prepreg (I) or (IV) does not exceed an amount of heat sufficient for increasing the temperature of the prepreg (I) or (IV) up to a temperature at least 10° C. lower than the softening point (Ts). In heating the prepreg (I) or (IV) under the above conditions, resin dust which has occurred during the cutting of the prepreg (I) or (IV) material is set on the prepreg (I) or (IV).

Preferred embodiments of the composite copper-clad laminate are detailed below.

The prepregs (I) or (IV) are heated for a short period of time one by one. The copper foil (II') is an electrodeposited copper foil having a folding endurance value both in the length direction and width direction, measured with an MIT tester with R=0.8 mm at 0.25 kg after heat-treated at 180° C. for 1 hour, of at least 600 times when it is a ½ oz/Ft² foil, at least 250 times when it is a 1 oz/Ft² foil and at least 50 times when it is a 2 oz/Ft² foil. Further, the prepreg (I) contains 5 to 30% by weight of an inorganic filler having an average particle diameter of 5 to 0.1 μm, at least 90% of which has a particle diameter of 5 to 0.02 μm, and the prepreg (I) shows a decrease in surface undulation based on the glass cloth. The above inorganic filler is selected from the group consisting of calcined kaolin, spherical melted silica, unswelling synthetic mica and finely milled glass. These inorganic fillers may be used alone or in combination. The inorganic filler may be surface-treated with a coupling agent.

The constitution of the present invention will be explained hereinafter.

The "copper-clad laminate" referred to in the present invention includes a copper-clad laminate formed of a woven glass fabric prepreg as a prepreg and a copper-clad laminate formed of an unwoven glass fabric prepreg as an intermediate layer and glass cloth prepregs as surface prepregs.

The present invention uses either the above prepreg (I) or a combination of the above prepregs (I) with the prepreg (IV) and the above copper foil (II) to form the above copper-clad laminate. Further, the present invention employs a method in which the laminate is cooled after removing the pressure of a press machine.

The woven glass fabric (I-1) used in the prepreg (I) of the present invention refers to a continuous plain-weave fabric obtained from at least one kind of yarn from glass fibers such as E-glass, S-glass, SII-glass, T-glass, D-glass, A-glass, C-glass, M-glass, G20 glass and quartz glass fibers. The woven glass fabric (I-1) used in the present invention has a thickness of $190 \pm 20$ μm, a weight of $210 \pm 20$ g/m$^2$, warp and weft counts of 35 to 38 yarns/25 mm and a warp and weft difference of 2 yarns or less in count.

When the above thickness, weight, warp and weft counts and warp and weft count difference of the woven glass fabric are outside the above ranges, undesirably, the effects of improving dimensional stability and freedom from bow/twist are small.

The above woven glass fabric is surface-treated with a silane-coupling agent or the like before use.

The glass fiber yarns constituting the glass cloth (I-1) are Z twist (right hand lay) yarns for both the warp and weft of the cloth, while preferred is a woven glass fabric formed of Z twist (right hand layer) yarns and S twist (left hand lay) yarns which are alternately laid for both the warp and weft of the cloth, since the degree of bow/twist can be further decreased.

The combination of the alternately laid Z twist and S twist yarns includes SZ, SSZ, ZZS, and the like, and the warp/weft combination of the alternately laid Z-twist and S-twist yarns includes SZ/SZ, SSZ/SSZ, ZZS/ZZS, SZ/SSZ, SSZ/SZ, ZZS/SZ, and the like. Preferred is the warp/weft combination of SZ/SZ.

Further, it is preferred to subject the woven glass fabric (I-1) to an opening treatment or an embrittling treatment. The opening treatment has the following advantages; The glass fabric is well impregnated with a thermosetting resin composition to be described later, a prepreg free of air voids is produced, and the pressing can be easily carried out at a low pressure. The embrittling treatment has the following advantages; The drilling processability of a laminate is improved as is already known. Further, the important point is that the bias of residual stress in pressing is decreased or residual stress itself is decreased, and that there are effects of improving dimensional accuracy and of decreasing the variabilities of thermal expansion coefficient and elastic modulus.

Particularly preferred is the woven glass fabric (I-1) which is subjected to the embrittling treatment. The woven glass fabric (I-1) is preferably treated under heat or with a chemical so that the tensile strength values both in the length and width directions are 20 to 50 kgf/25 mm, preferably 30 to 40 kgf/25 mm. The embrittling treatment decreases the strength of the woven glass fabric (I-1), and is therefore not suitable for using the woven glass fabric (I-1) in a copper-clad laminate which is required to have high strength.

The unwoven glass fabric used in the intermediate prepreg (IV) in the present invention refers to an unwoven glass fabric obtained by treating a fiber of E-glass, A-glass, C-glass, M-glass, G20-glass or the like with a binder. It is a continuous unwoven glass fabric having a thickness of 0.1 to 0.8 mm, and particularly preferred is an unwoven glass fabric formed of E-glass.

The above unwoven glass fabric may be surface-treated with a silane-coupling agent, etc., before use.

Examples of the thermosetting resin used for the impregnation of the glass fabric include thermosetting resins such as an epoxy resin, an unsaturated polyester resin, a cyanate resin, a bismaleimide-cyanate resin and a polyimide resin; a composition of at least two of these thermosetting resins; a modification product prepared by any one of the above thermosetting resin or the above composition with polyvinyl butyral, acrylonitrile-butadiene rubber, a polyfunctional acrylate compound, other known resin or other known additive; and a crosslinking thermosetting resin composition containing at least one of crosslinking polyethylene, a crosslinking polyethylene/epoxy resin, a crosslinking polyethylene/cyanate resin, a polyphenylene ether/epoxy resin, a polyphenylene ether/cyanate resin, a polyester carbonate/cyanate resin and other modified thermosetting resins [IPN (interpenetrating polymer network) or semi-IPN].

In the present invention, an epoxy resin is particularly preferred. Specific examples of the epoxy resin include a bisphenol A epoxy resin, a phenol novolak epoxy resin, a cresol novolak epoxy resin, a brominated bisphenol A epoxy resin, a brominated phenol novolak resin and other epoxy resin having at least three functional groups. The epoxy resin is used as a mixture thereof with a known curing agent or a curing catalyst. The curing agent includes dicyandiamide, phenols such as diaminodiphenylmethane and a phenol novolak resin and acid anhydride. The curing catalyst includes imidazoles such as 2-methylimidazole, 2-ethyl-4-methylimidazole, 2-undecylimidazole, 2-pentadecylimidazole, 2-phenylimidazole and 1-benzyl-2-methylimidazole and amines such as benzyldimethylamine.

The prepreg (I) used in the present invention is prepared by impregnating the above glass cloth with the above thermosetting resin in an amount of 30 to 50% by weight based on the prepreg (I), and drying the impregnated glass cloth to bring it into a B-stage. The prepreg (I) used in the present invention may contain a flame retardant, a lubricant, a surface-smoothing, filler, an ultraviolet absorbent, a fluorescent and others as required.

In the present invention, it is particularly preferred to decrease or delete the undulation based on the texture of the glass cloth by incorporating an inorganic filler. The inorganic filler has an average particle diameter of 5 to 0.02 μm, at least 90% by weight of which has a particle diameter of 5 to 0.02 μm. The amount of the inorganic filler based on the prepreg (I) is 5 to 30% by weight.

Examples of the above inorganic filler include silicas such as natural silica, fused silica and amorphous silica, white carbon, titanium white, aerosil, clay, talc, wollastonite, natural mica, kaolin, aluminum hydroxide, magnesia, alumina, pearlite, and finely milled glass powders of E-glass, A-glass, C-glass, L-glass, D-glass, S-glass, M-glass and G20-glass. Particularly preferred are calcined kaolin, spherical fused silica, unswelling synthetic mica and finely milled glass powders, since copper-clad laminates having well-balanced properties can be obtained. The above inorganic filler may be surface-treated with a coupling agent as required.

The intermediate prepreg (IV) is obtained by impregnating an unwoven glass fabric with a thermosetting resin containing 30 to 50% by weight, based on the prepreg (IV), of an inorganic filler. This inorganic filler is selected from above-described inorganic fillers. When the amount of the inorganic filler based on the prepreg (IV) is less than 30% by weight, undesirably, the copper-clad laminate is poor in physical properties such as reliability concerning the formability of through holes and moisture-absorption/heat resistance. When it exceeds 50% by weight, undesirably, the unit weight increases and the mechanical properties such as flexural strength deteriorate. The prepreg (IV) may contain a flame retardant, a lubricant and other additives as required.

The prepreg (I) or (IV) i s a prepreg prepared by cutting the prepreg (I) or (IV) material into sheets (prepregs (I) or (IV)) having predetermined size and heating the prepreg(s) (I) or (V) while being stacked one on another or not stacked with a far infrared ceramic heater for a short period of time to set resin dust which has occurred during the cutting on the prepreg (I) or (IV) under the conditions where (a) the interior of the prepreg (I) or (IV) is temperature-increased only up to a temperature well below the softening point (Ts) of the matrix resin of the prepreg (I) or (V), (b) the surface of the prepreg (1) or (IV)is temperature-increased up to a temperature higher than the above softening point (Ts) and (c) the amount of heat applied to the prepreg (I) or (IV) does not exceed an amount of heat sufficient for increasing the temperature of the prepreg (I) or (IV) up to a temperature at least 10° C. lower than the softening point (Ts). In particular, it is preferred to use the prepregs (I) which are heated one by one for a short period of time, since not only flaws to be caused on the copper foil surface of the copper-clad laminate by matrix resin dust, etc., can be prevented, but also the copper-clad laminate is improved in dimensional accuracy.

For satisfying the above conditions (a), (b) and (c), it is required to use a far infrared ceramic heater. And, preferably, at least 70% of the entire radiation energy from the far infrared ceramic heater has a wavelength of 4 μm to 30 μm. The time required for the heating is generally approximately 1 to 10 seconds, particularly preferably 2 to 5 seconds.

The copper foil used in the present invention is selected from copper foils having very high ductility. That is, it has a ductility, measured in an atmosphere at 180° C. both in the length and width directions, of at least 10% when it is a ½ oz/Ft² foil, at least 15% when it is a 1 oz/Ft² foil and at least 20% when it is a 2 oz/Ft² foil. It preferably has a ductility both in the length direction and width direction, measured in an atmosphere at 180° C., of at least 20% when it is a ½ oz/Ft² foil, at least 30% when it is a 1 oz/Ft² foil and at least 40% when it is a 2 oz/Ft² foil. The copper foil is particularly preferably an electrodeposited copper foil having a folding endurance value both in the length direction and width direction, measured with an MIT tester with R=0.8 mm at 0.25 kg after heat-treated at 180° C. for 1 hour, of at least 600 times when it is a ½ oz/Ft² foil, at least 250 times when it is a 1 oz/Ft² foil and at least 50 times when it is a 2 oz/Ft² foil.

When the prepreg of an unwoven glass fabric is used as an intermediate layer, there is used a copper foil having ductility, both in the length direction and width direction, measured in an atmosphere at 180° C., of at least 20% when it is a ½ oz/Ft² foil, at least 30% when it is a 1 oz/Ft² foil and at least 40% when it is a 2 oz/Ft² foil.

In the present invention, the copper-clad laminate is produced by preparing a set of at least one prepreg (I) and the copper foil(s) or a set of at least one unwoven substrate prepreg (IV) as an intermediate layer, two woven fabric substrate prepregs (I), one stacked on one surface of the prepreg (IV) and the other stacked on the other surface of the prepreg (IV) and copper foil(s) as outermost layer(s), laminate-forming the above set under heat and pressure to form a laminate, terminating the application of the pressure (reduction of the pressure to 0.G), and cooling the laminate (method of cooling under no application of pressure).

The cooling after the laminate formation is generally carried out while the laminate is under pressure. In this method, however, the laminate shows poor dimensional stability, and the laminate is subjected to an annealing treatment for improving the dimensional stability. For some improvement, there is a method in which the laminate is cooled while it is under pressure, then the pressure is released, and the laminate is heated up to a temperature higher than the glass transition temperature of the cured resin and then cooled. However, this method is inferior in productivity, since it requires a reheating step. In general, in this method, the annealing treatment takes approximately 2 to 4 hours, and the reheating and cooling takes approximately 1 to 2 hours. There is another method in which a low pressure is exerted. However, this method is insufficient for dimensionally stabilizing the laminate.

On the other hand, in the method of cooling under no application of pressure, employed in the present invention, the cooling step is carried out under substantially no pressure, and the dimensional stability is achieved without substantially impairing the productivity.

The copper-clad laminate of the present invention is useful as an internal printed wiring board due to its dimensional stability. Further, the prepreg used in the present invention, particularly, the prepreg containing the inorganic filler is useful as an adhesive prepreg for forming a multi layered board.

EXAMPLES

The present invention will be explained hereinafter by reference to Examples, in which "part" and "%" stand for "part by weight" and "% by weight" unless otherwise specified.

Example 1

100 Parts of a brominated bisphenol A epoxy resin (trade name: Epikote 1045, epoxy equivalent 450–500, Br content 18–20%, supplied by Yuka Shell Epoxy Kabushiki Kaisha), 3.5 parts of dicyandiamide and 0.2 part of 2-ethyl-4-methylimidazole were dissolved in a mixed solvent prepared from methyl ethyl ketone and N,N'-dimethylformamide to obtain a varnish (to be referred to as "varnish 1" hereinafter).

A woven E-glass fiber fabric having a thickness of 0.19 mm, a weight of 220 g/m² and counts of 37 yarns/25 mm as warp and 38 yarns/25 mm as weft was impregnated with the varnish 1, dried at 160° C. for 3 minutes and cut into a predetermined size to give prepregs having a resin content of 42% (to be referred to as "PP-1" hereinafter).

The above-obtained prepregs PP-1 were treated in a continuous method matrix resin dust-fixing apparatus using a far infrared ceramic heater under conditions where the heating time was 5 seconds and the maximum temperature of the prepreg surface was 75° C., whereby matrix resin dust-fixed prepregs were obtained.

Eight prepregs PP-1 were stacked, and two ½ oz/Ft² copper foils B-1 which are described in Table 1 were stacked on both surfaces of the stacked set of the prepregs PP-1, one copper foil on one surface and the other on the other surface. Then, the resultant set was sandwiched with stainless steel mirror-finished surface plates, placed in a press machine, and treated under heat at 170° C. under pressure of 30 kg/cm² for 90 minutes. Then, the pressure was reduced to O.G, and the above set was cooled (under no application of pressure) to give a copper-clad laminate having a thickness of 1.6 mm.

The above copper-clad laminate was measured for dimensional stability and bow/twist. Table 2 shows the results. Further, the above copper-clad laminate was measured for a thermal expansion coefficient between −30° and 80° C. by a thermomechanical analysis (TMA) method and elastic constants at −30° C. and 80° C. by a DMA method. Table 3 shows the results.

Examples 2-5

Example 1 was repeated except that the woven E-glass fiber fabric was replaced with a woven E-glass fiber fabric which was embrittled so that the tensile strength in the length direction was changed from 60 kgf/25 mm to 45 kgf/25 mm and that the tensile strength in the width direction was changed from 50 kgf/25 mm to 40 kgf/25 mm (Example 2), except that the copper foils were replaced with ½ oz/Ft² copper foils C-1, or except that the woven E-glass fiber fabric was replaced with SZ woven fabrics in which S twist yarns and Z twist yarns were alternately laid as warp and weft (Examples 4 and 5). The so-obtained copper-clad laminates were measured in the same manner as in Example 1. Tables 2 and 3 show the results.

Comparative Examples 1-4

Copper-clad laminates were obtained in the same manner as in Example 1 except that the materials and/or conditions (counts, cooling after the removal of application of pressure, and the like) were changed as shown in Table 2. The so-obtained copper-clad laminates were measured in the same manner as in Example 1. Table 2 shows the results.

TABLE 1

| | | (Properties of copper foils) | | | | | | | | |
|---|---|---|---|---|---|---|---|---|---|---|
| Copper foil | No. Thickness | A-1 ½ oz/Ft² | A-2 1 oz/Ft² | A-3 2 oz/Ft² | B-1 1/20 oz/Ft² | B-2 1 oz/Ft² | B-3 2 oz/Ft² | C-1 ½ oz/Ft² | C-2 1 oz/Ft² | C-3 2 oz/Ft² |
| Ductility in atmosphere at 180° C. | Lengthwise | 1.0 | 2.0 | 2.0 | 11 | 5 | 5 | 28 | 39 | 46 |
| | Widthwise | 2.0 | 2.0 | 2.0 | 14 | 5 | 5 | 25 | 35 | 46 |
| Ductility after treatment at 180° C. for 1 hour (%) | Lengthwise | 8 | 11 | 16 | 12 | 19 | 27 | 14 | 24 | 35 |
| | Widthwise | 9 | 13 | 16 | 12 | 22 | 26 | 15 | 25 | 31 |
| Folding endurance after treatment at 180° C. for 1 hour (times) | Lengthwise | 230 | 96 | 20 | 380 | 110 | 32 | 620 | 280 | 55 |
| | Widthwise | 251 | 84 | 19 | 375 | 107 | 30 | 660 | 270 | 52 |

TABLE 2

| | | | (Dimensional stability and distortion) | | | | | |
|---|---|---|---|---|---|---|---|---|
| | Copper foil | Thickness (mm) | G/C Warp/weft | Treatment | Cooling after removal of pressure | Ratio of dimensional change after heating*1 Lengthwise | Widthwise | Bow & twist*2 (mm) |
| Ex. 1 | B-1 | 1.6 | 37/38 | — | Yes | 0.005 | 0.005 | 1.0 |
| Ex. 2 | B-1 | 1.6 | 37/38 | Embrittled | Yes | 0.002 | 0.002 | 0.5 |
| Ex. 3 | C-1 | 1.6 | 37/38 | — | Yes | 0.002 | 0.002 | 0.7 |
| Ex. 4 | B-1 | 1.6 | 37/38 | SZ | Yes | 0.005 | 0.005 | 0.2 |
| Ex. 5 | B-1 | 0.6 | 37/38 | SZ | Yes | 0.005 | 0.005 | 2.0 |
| CEx. 1 | B-1 | 0.6 | 41/31 | — | Yes | 0.01 | 0.02 | 3.5 |
| CEx. 2 | A-1 | 1.6 | 41/31 | — | No | 0.03 | 0.04 | 2.5 |
| CEx. 3 | A-1 | 1.6 | 41/31 | — | Yes | 0.02 | 0.03 | 2.0 |
| CEx. 4 | B-1 | 1.6 | 41/31 | — | Annealing*3 | 0.02 | 0.03 | 2.5 |

Notes:
Ex. = Example,
CEx. = Comparative Example
*1: According to JIS C6481 (1990) 5.16(3) (heating at 170° C.)
*2: Fifteen 170 × 240 (mm) plates were taken out from a 1,020 × 1,020 (mm) laminate and measured to determine an average value.
*3: Treated at 145° C. for 120 minutes.

Table 2 clearly shows that the copper-clad laminates of the present invention (Examples 1-5) are remarkably superior to those using conventional glass fabrics (Comparative Examples 1-4) and further that the embrittling treatment, proper copper foils and use of SZ woven fabrics as glass fabrics produce produce effects. Further, clearly, the cooling under no application of pressure produces an effect.

TABLE 3

(Thermal expansion coefficient and elastic constant)

| | Thermal expansion coefficient $(10^6 K^{-1})$ | | | Elastic coefficient (GPa) | | | |
|---|---|---|---|---|---|---|---|
| | X | Y | Z | X | Y (−30° C.) | X | Y (80° C.) |
| Ex. 1 | 11 | 11 | 45 | 14.5 | 14.5 | 13.8 | 13.8 |
| Ex. 2 | 11 | 11 | 45 | 14.5 | 14.5 | 13.8 | 13.8 |
| Ex. 3 | 11 | 11 | 45 | 14.5 | 14.5 | 13.8 | 13.8 |
| Ex. 4 | 11 | 11 | 45 | 14.5 | 14.5 | 13.8 | 13.8 |
| Ex. 5 | 11 | 11 | 45 | 14.5 | 14.5 | 13.8 | 13.8 |
| CEx. 1 | 12 | 10 | 45 | 14.1 | 15.0 | 13.5 | 14.0 |
| CEx. 2 | 12 | 10 | 45 | 14.1 | 15.0 | 13.5 | 14.0 |
| CEx. 3 | 12 | 10 | 45 | 14.1 | 15.0 | 13.5 | 14.0 |
| CEx. 4 | 12 | 10 | 45 | 14.1 | 15.0 | 13.5 | 14.0 |

Table 3 clearly shows that the copper-clad laminate of the present invention the difference in thermal expansion coefficient and elastic constant is very small between X and Y directions.

Example 6

Example 1 was repeated except that the varnish 1 was replaced with a varnish prepared by adding a synthetic fluorine mica (product No.: #200-775S-S181, supplied by COOP CHEMICAL CO., LTD.) to obtain prepregs having a resin content of 35% and a filler amount of 20% (to be referred to as "PP-2" hereinafter, and a copper-clad laminate was obtained from the prepregs PP-2 in the same manner as in Example 1.

The above-obtained copper-clad laminate was measured for a smoothness of its copper foil surface. Table 4 shows the results as its concavoconvex height (=Rz unit, μm) and a periodic undulation which generally appears in the measurement direction and corresponds to a texture of glass cloth (presence or absence of undulation), together with the measurement results of Example 1.

Table 5 shows the results of the soldering heat resistance after pressure cooker (PCT) of the copper-clad laminates obtained in Example 6, Example 1 and Comparative Example 1.

TABLE 4

| (Surface smoothness, Rz unit (μm); undulation | | | |
|---|---|---|---|
| | X | Y | 45° direction | Undulation |
| Example 1 | 4.0 | 4.0 | 4.3 | Yes |
| Example 6 | 1.8 | 1.8 | 1.8 | No |

Table 4 clearly shows that the copper-clad laminate obtained in Example 1 had an undulation corresponding to a texture of glass cloth, while the copper-clad laminate obtained in Example 6 had no undulation and had an uneven surface of a copper foil alone.

TABLE 5

| Soldering heat resistance after PCT *1 (Delaminated or not delaminated) | | |
|---|---|---|
| | After 4 hours' PCT | After 6 hours' PCT |
| Example 1 | No | Slightly delaminated |
| Example 6 | No | No |
| Comparative | No | Slightly delaminated |

TABLE 5-continued

| Soldering heat resistance after PCT *1 (Delaminated or not delaminated) | | |
|---|---|---|
| | After 4 hours' PCT | After 6 hours' PCT |
| Example 1 | | |

*1: Immersion in solder (260° C., 10 seconds) after PCT (1.0 kg/cm$^2$G, 4 and 6 hours)

Example 7

Aluminum hydroxide (Al$_2$O$_3$3H$_2$O) was added to the same varnish as the varnish 1 used in Example 1 such that the amount of the aluminum hydroxide was 37.5% based on the resin solid content, and the mixture was stirred to obtain a filler-containing varnish (to be referred to as "varnish 2" hereinafter).

An unwoven glass fabric having a thickness of 0.25 mm and a weight of 50 g/m$^2$ was impregnated in the varnish 2, dried at 160° C. for 4 minutes, and cut to predetermined size to give prepregs having a resin/filler total content of 80% (filler 30%) (to be referred to as "PP-3" hereinafter).

The same PP-1 as those of Example 1 and the above PP-3 were treated in a continuous method powder-setting apparatus using a far infrared ceramic heater under conditions where the heating time was 5 seconds and the maximum temperature of the prepreg surfaces was 75° C. to give powder-set prepregs.

Six prepregs PP-3 were stacked, two prepregs PP-1 were stacked on both surfaces of the stacked set of the prepregs PP-3, one PP-1 on one surface and the other on the other surface, and two ½ oz/Ft$^2$ copper foils C-1 which are described in Table 1 were stacked on both surfaces of the stacked set of the prepregs PP-3 and PP-1, one copper foil on one surface and the other on the other surface. Then, the resultant set was sandwiched with stainless steel mirror-finished surface plates, placed in a press machine, and treated under heat at 170° C. under pressure of 30 kg/cm$^2$ for 90 minutes. Then, the pressure was reduced to 0.G, and the above set was cooled (under no application of pressure) to give a composite copper-clad laminate having a thickness of 1.6 mm. This composite copper-clad laminate was measured for dimensional stability and bow/twist. Table 6 shows the results.

Example 8

Example 7 was repealed except that the aluminum hydroxide was replaced with the same synthetic fluorine mica as that used in Example 6 and that the prepregs PP-1 were replaced with the prepregs PP-2 obtained in Example 6. Table 6 shows the results.

Table 7 shows the results of the soldering heat resistance after pressure cooker (PCT) of the copper-clad laminates obtained in Example 7, Example 8 and Comparative Example 6.

Comparative Examples 5–11

Composite opper-clad laminates were obtained in the same manner as in Example 7 except that the materials and/or conditions (copper foil, counts, cooling after the removal of application of pressure, and the like) were changed as shown in Table 6. The so-obtained composite copper-clad laminates were measured in the same manner as in Example 7. Table 6 shows the results.

TABLE 6

(Dimensional stability and bow/twist)

| | Copper foil | Warp/weft counts of surface PP | Cooling after removal of pressure | Ratio of dimensional change after heating*1 Lengthwise | Widthwise | Bow & twist*2 (mm) |
|---|---|---|---|---|---|---|
| Ex. 7 | C-1 | 37/38 | Yes | −0.005 | −0.01 | 0.5 |
| Ex. 8 | C-1 | 37/38 | Yes | −0.005 | −0.01 | 0.5 |
| CEx. 5 | B-1 | 37/38 | Yes | −0.01 | −0.02 | 1.0 |
| CEx. 6 | A-1 | 37/38 | Yes | −0.02 | −0.03 | 1.0 |
| CEx. 7 | C-1 | 42/32 | Yes | −0.01 | −0.03 | 2.0 |
| CEx. 8 | B-1 | 42/43 | Yes | −0.01 | −0.03 | 2.0 |
| CEx. 9 | A-1 | 42/43 | Yes | −0.03 | −0.05 | 2.0 |
| CEx. 10 | A-1 | 42/32 | Np | −0.05 | −0.07 | 2.0 |
| CEx. 11 | B-1 | 42/33 | Annealing*3 | −0.01 | −0.03 | 2.0 |

Notes:
Ex. = Example,
CEx. = Comparative Example
*1: According to JIS C6481 (1990) 5.16(3) (heating at 170° C.)
*2: Fifteen 170 × 240 (mm) plates were taken out from a 1.020 × 1,020 (mm) laminate and measured to determine an average value.
*3: Treated at 145° C. for 120 minutes.

Table 6 clearly shows that the composite copper-clad laminate of the present invention is remarkably excellent over those using copper foils having low ductility (Comparative Examples 5 and 6) in dimensional stability and bow/twist. When woven glass fabric conventionally widely used is used as a surface prepreg (Comparative Example 7), the composite copper-clad laminate is inferior in dimensional stability, particularly in the width direction, and shows great bow/twist even if the copper foils defined in the present invention are used. Further, when Comparative Example 8 and Comparative Example 11 are compared, it can be understood that the cooling under no application of pressure produces an effect equal to or higher than that of annealing treatment on laminates of a conventional method. The effect of the cooling under no application of pressure is clear from a comparison between Comparative Example 9 and Comparative Example 10.

TABLE 7

Soldering heat resistance after PCT *1
(Delaminated or not delaminated)

| | After 4 hours' PCT | After 6 hours' PCT |
|---|---|---|
| Example 7 | No | Slightly delaminated |
| Example 8 | No | No |
| Comparative Example 6 | No | Slightly delaminated |

*1: Immersion in solder (260° C., 10 seconds) after PCT (1.0 kg/cm²G, 4 and 6 hours)

As is clear from the foregoing description, the copper-clad laminate according to the process for the production of a copper-clad laminate, provided by the present invention, shows excellent dimensional stability, and its bow/twist is small. It shows little difference in thermal expansion and elastic constant between X-Y directions, and its bow/twist is small. It is therefore clear that the copper-clad laminate provided by the process of the present invention is excellent over conventional ones. Further, when an embrittled woven glass fabric is subjected to embrittling treatment, the copper-clad laminate is greatly improved in dimensional stability and freedom from bow/twist as well. When SZ woven fabric is used, the copper-clad laminate shows great improvement with regard to bow/twist. Further, when an inorganic filler is incorporated, the copper-clad laminate can have excellent surface smoothness as well. Further, it can be understood that the process of the present invention is excellent in productivity due to the use of the cooling under no application of pressure.

Accordingly, the copper-clad laminate according to the process of the present invention can be easily produced, and the process of the present invention has industrially remarkable significance.

What is claimed is:

1. A process for the production of a copper-clad laminate by placing one prepreg formed of a glass cloth and a thermosetting resin or stacking at least two prepregs formed as above, either placing a copper foil on one surface of the prepreg or the stacked set of the prepregs or placing copper foils on both surfaces of the prepreg or the stacked set of the prepregs, one copper foil on one surface each, and laminate-molding the resultant set, wherein:

the prepreg (I) comprises a glass cloth (I-1) having a thickness of 190±20 μm, a weight of 210±20 g/m², warp and weft counts of 35 to 38 yarns/25 mm and a warp and weft difference of 2 yarns or less in count, in which the prepreg (I) is prepared by cutting in a predetermined size and then heating the prepreg or prepregs while being stacked one on another or not stacked with a far infrared ceramic heater for a short period of time under the conditions where (a) the interior of the prepreg or prepregs (I) is temperature-increased only up to a temperature well below the softening point (Ts) of the matrix resin of the prepreg or prepregs (I), (b) the surface of the prepreg or prepregs (I) is temperature-increased up to a temperature higher than the above softening point (Ts) (c) the amount of heat applied to the prepreg or prepregs (I) does not exceed an amount of heat sufficient for increasing the temperature of the prepreg or prepregs (I) up to a temperature at least 10° C. lower than the softening point (Ts), thereby fixing matrix resin dust present on surfaces and edges of the prepreg or prepregs (I) to the prepreg or prepregs (I), the copper foil (II) has a ductility, measured in atmosphere at 180° C. in length and width directions, of at least 10% when it is a ½ oz/Ft² foil, at least 15% when it is a 1 oz/Ft² foil and at least 20% when it is a 2 oz/Ft² foil and the laminate-molding is carried out by curing the set of the prepreg or prepregs and copper foil or copper foils under predetermined heat in a laminate-molding step using a press machine, removing the application of pressure and then cooling the resultant laminate in the press machine.

2. A process according to claim 1, wherein the prepreg or prepregs (I) are heated for a short period of time without stacking them.

3. A process according to claim 1, wherein a glass cloth whose warp and weft are both formed of Z twist yarns and S twist yarns which are alternately laid is used as the glass cloth (I-1).

4. A process according to claim 1, wherein a glass cloth whose tensile strength is embrittled to 20 to 50 kgf/25 mm both in the length and width directions is used as the glass cloth (I-1).

5. A process according to claim 1, wherein a copper foil having a ductility, in the length and width directions, of at least 20% when it is a ½ oz/Ft$^2$ foil, at least 30% when it is a 1 oz/Ft$^2$ foil and at least 40% when it is a 2 oz/Ft$^2$ foil is used as the copper foil (II).

6. A process according to claim 4, wherein an electrodeposited copper foil having a folding endurance value both in the length direction and width direction, measured with an MIT tester with R=0.8 mm at 0.25 kg after being heat-treated at 180° C. for 1 hour, of at least 600 times when it is a ½ oz/Ft$^2$ foil, at least 250 times when it is a 1 oz/Ft$^2$ foil and at least 50 times when it is a 2 oz/Ft$^2$ foil is used as the copper foil (II).

7. A process according to claim 1, wherein 5 to 30% by weight of an inorganic filler having an average particle diameter of 5 to 0.1 μm, at least 90% of which has a particle diameter of 5 to 0.02 μm, is incorporated into the prepreg or prepregs (I) to decrease surface undulation based on the glass cloth.

8. A process according claim 7, wherein at least one member selected from the group consisting of calcined kaolin, spherical fused silica, unswelling synthetic mica and finely milled glass which are optionally surface-treated with a coupling agent is used as the inorganic filler.

9. A process for the production of a composite copper-clad laminate by stacking prepregs formed of a glass cloth and a thermosetting resin on both surfaces or an intermediate prepreg, one prepreg on one surface each, placing a copper foil on one surface of the stacked set of the prepregs or placing copper foils on both surfaces of the stacked set of the prepregs, one copper foil on one surface each, and laminate-molding the resultant set, wherein:

a prepreg (I) comprising a glass cloth (I-1) having a thickness of 190±20 μm, a weight of 210±20 g/m$^2$, warp and weft counts of 35 to 38 yarns/25mm and a warp and weft difference of 2 yarns or less in count is used as the prepreg, a prepreg (IV) formed of a glass unwoven fabric and a thermosetting resin is used as the intermediate prepreg, in which the prepreg (I) or the intermediate prepreg (IV) is a prepreg prepared by cutting in a predetermined size and then heating the prepreg or prepregs while being stacked one on another or not stacked with a far infrared ceramic heater for a short period of time under the conditions where (a) the interior of the prepreg (I) or the intermediate prepreg (IV) is temperature-increased only up to a temperature well below the softening point (Ts) of the matrix resin or the prepreg or prepregs, (b) the surface of the prepreg or prepregs is temperature-increased up to a temperature higher than the above softening point (Ts) (c) the amount of heat applied to the prepreg or prepregs does not exceed an amount of heat sufficient for increasing the temperature of the prepreg or prepregs up to a temperature at least 10° C. lower than the softening point (Ts), thereby fixing matrix resin dust present on surfaces and edges of the prepreg or prepregs to the prepreg or prepregs, a copper foil (II') having a ductility, measured in atmosphere at 180° C. in length and width directions, of at least 20% when it is a ½ oz/Ft$^2$ foil, at least 30% when it is a 1 oz/Ft$^2$ foil and at least 40% when it is a 2 oz/Ft$^2$ foil is used as the copper foil, and the laminate-molding is carried out by curing the set of the prepreg or prepregs and copper foil or copper foils under predetermined heat in a laminate-molding step using a press machine, removing the application of pressure and then (III) cooling the resultant laminate in the press machine.

10. A process according to claim 9, wherein the prepreg or prepregs are heated for a short period of time without stacking them.

11. A process according to claim 9, wherein an electrodeposited copper foil or electrodeposited copper foils having a folding endurance value both in the length direction and width direction, measured with an MIT tester with R=0.8 mm at 0.25 kg after heat-treated at 180° C. for 1 hour, of at least 600 times when they are ½ oz/Ft$^2$ foils, at least 250 times when they are 2 oz/Ft$^2$ foils and at least 50 times when they are 2 oz/Ft$^2$ foils are used as the copper foil or copper foils.

12. A process according to claim 9, wherein 5 to 30% by weight of an inorganic filler having an average particle diameter of 5 to 0.1 μm, at least 90% of which has a particle diameter of 5 to 0.02 μm, is incorporated into the prepreg (I) to decrease surface undulation based on the glass cloth.

13. A process according to claim 12, wherein at least one member selected from the group consisting of calcined kaolin, spherical fused silica, unswelling synthetic mica and finely milled glass which are optionally surface-treated with a coupling agent is used as the inorganic filler.

* * * * *

UNITED STATES PATENT AND TRADEMARK OFFICE
CERTIFICATE OF CORRECTION

PATENT NO. : 5,435,877

DATED : July 25, 1995

INVENTOR(S) : KENJI ISHII, YOSHINORI KONDO, HIROYUKI MATSUMOTO and TAKAMASA NAKAI It is certified that error appears in the above-indentified patent and that said Letters Patent is hereby corrected as shown below:

column 16, line 10) change "or" (first occurrence) to —of—.

column 16, line 42) change the phrase "2 oz/Ft$^2$" to read —1 oz/Ft$^2$—.

Signed and Sealed this

Third Day of September, 1996

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,435,877

DATED : July 25, 1995

INVENTOR(S) : Kenji Ishii, et al

It is certified that error appears in the above-indentified patent and that said Letters Patent is hereby corrected as shown below:

Column 15, line 43, "or" should read --of--.

Signed and Sealed this

Seventh Day of January, 1997

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,435,877
DATED : July 25, 1995
INVENTOR(S) : Kenji Ishii, et al

It is certified that error appears in the above-indentified patent and that said Letters Patent is hereby corrected as shown below:

Column 15, line 43, "or" should read --of --.

Signed and Sealed this

First Day of April, 1997

Attest:

BRUCE LEHMAN

*Attesting Officer*  *Commissioner of Patents and Trademarks*